March 24, 1970 C. P. SANDBANK ET AL 3,502,907

SEMICONDUCTIVE CIRCUIT

Filed June 19, 1967

Inventors
CARL P. SANDBANK
JOHN S. HEEKS
By Percy P. Lantzy
Attorneys

United States Patent Office 3,502,907

Patented Mar. 24, 1970

3,502,907

SEMICONDUCTIVE CIRCUIT

Carl P. Sandbank, Bishop's Stortford, and John S. Heeks, Harlow, England, assignors to International Standard Electric Corporation, New York, N.Y., a corporation of Delaware Filed June 19, 1967, Ser. No. 647,155

Claims priority, application Great Britain, June 28, 1966, 28,874/66

Int. Cl. H03k 19/08

U.S. Cl. 307—238 5 Claims

ABSTRACT OF THE DISCLOSURE

A semiconductive circuit arrangement employing a body of semiconductive material which exhibits high field instabilities. By overdriving the semiconductive circuit impact ionization of the semiconductive material occurs during propagation of the high field domain which is formed in the body. Impact ionization, which is due to the temporary ionization of additional deep impurity levels, causes the conductivity profile of the body, and thereby the output current of the semiconductive circuit to be modified in accordance with the degree of field variation. The conductivity profile decays as the levels relax to their un-ionized state, but the "memory" remains for a time which is dependant on the equilibrium free carrier concentration of the semiconductive material and the concentration of deep impurity levels which are temporarily ionized and which is typically of the order of 1 μs.

Figure 1:
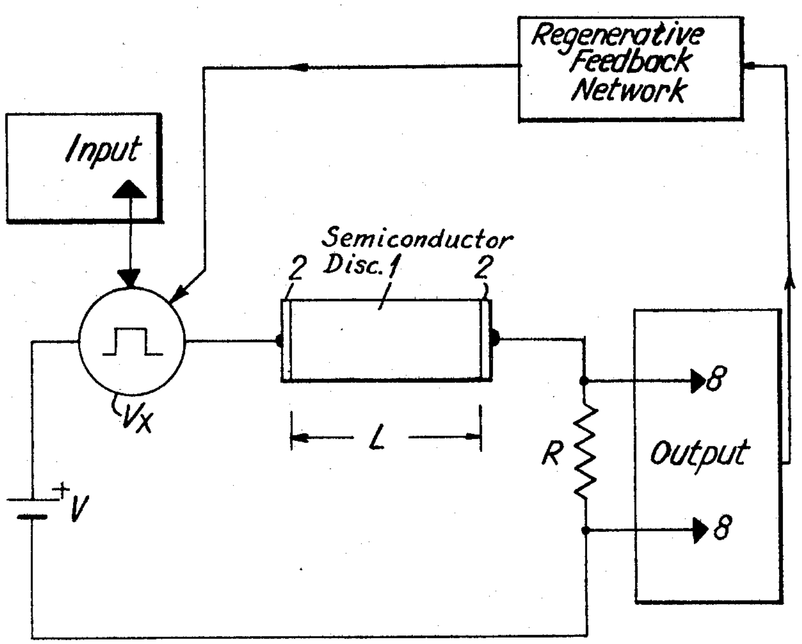

This arrangement therefore provides a short term memory device.

BACKGROUND OF THE INVENTION

This invention relates to semiconductor devices including semiconductive material exhibiting moving high field instability effects.

If a crystal of certain semiconductive materials is subjected to a steady electrical field exceeding a critical threshold value the resultant current flowing through the crystal contains an oscillatory component of frequency determined by the transit of a space charge distribution between the crystal contact areas.

The phenomenon occurs at ordinary temperatures, does not require an applied magnetic field and does not appear to involve a special specimen doping or geometry; it was first reported by J. B. Gunn (Solid State Communications, vol. 1, p. 88, 1963) and is therefore known as the Gunn effect. The Gunn effect arises from the heating of electrons, normally in a low effective mass high mobility sub-band (K=0), by the electric field and consequent transfers into a higher effective mass lower mobility sub-band (K=100). This process gives rise to an electron drift velocity (or current) versus applied field characteristic with a region of negative differential conductivity. For an applied bias within the negative conductance region a high field region, termed a domain, moves from cathode to anode during one cycle of current oscillation.

The frequency of oscillation is determined primarily by the length of the current path through the crystal. The phenomenon has been detected, as previously stated, in III–V semiconductors such as gallium arsenide and indium phosphide having n-type conductivity.

The term "semiconductive material exhibiting high field instability effects" is used herein to include any material exhibiting the effects as defined in the preceding paragraphs, or exhibiting similar functional phenomena which may be based on somewhat different internal mechanisms.

The value of the applied field below which spontaneous self-oscillation does not occur will be termed the threshold value. If the value of the steady electrical field at some point within the body is caused by the action of an input signal to exceed the threshold value for a time shorter than the instability transit time between the two contact areas between which the field is applied, the current passed through the body by the external source of potential difference will undergo a single excursion from its steady state value provided the steady electrical field is sufficient to sustain the domain to provide an output pulse giving power gain.

SUMMARY

The invention provides a semiconductive circuit arrangement including a body of semiconductive material which exhibits high field instability effects, and means for applying between spaced contacts on said body a first potential difference producing within said body an electrical field which exceeds the threshold value thereby causing a high field domain to be formed which will propagate along said body, wherein a second potential difference is applied between said spaced contacts during the propagation of said high field domain which varies the electrical field across said high field domain, the magnitude of the varying electrical field across said high field domain being such that as said high field domain propagates along said body the conductivity profile therealong and thereby the output current of said semiconductive circuit arrangement is caused to be modified in accordance with said field variations.

IN THE DRAWING

Figure 2:
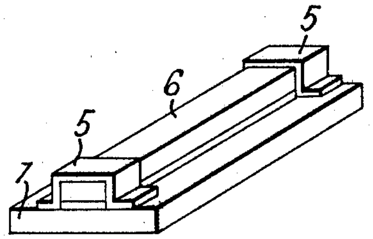

FIGURE 1 shows diagrammatically a pulse generator unit according to the invention; and FIGURE 2 shows a practical fabricated construction for the semiconductor device shown in the drawing according to FIGURE 1.

DETAILED DESCRIPTION

Referring to FIGURE 1, the active semiconductor element, for example, of n-type gallium arsenide consists of a parallel-sided disc 1 having ohmic contact areas 2 secured to its plain faces. A undirectional voltage source V is used to apply a potential difference of controllable value between the contact areas 2, and the output circuit includes the resistor R and terminals 8 and is arranged to extract any oscillatory component of the current flowing in the crystal.

The phenomenon referred to in the preceding paragraphs manifests itself by the appearance in the output circuit (i.e. between the terminals 8) of an oscillatory component in the current through the crystal 1 when the potential difference applied across the crystal from the unidirectional voltage source V exceeds a critical threshold value; for a crystal of gallium arsenide of length $2\times10^{-2}$ cm. the critical potential difference necessary to cause such oscillation is on the order of 60 volts, corresponding to a field within the crystal on the order of 3,000 volts per centimeter; the self-oscillatory frequency is directly related to the length L of the crystal which in practice would be of the order of 1 mm.–2.5 mm. and for the above example is on the order of $10^9$ cycles per second.

If at any time during the period a high field domain (established within the semiconductive disc 1 when the electrical field therein exceeds the threshold value for the semiconductive material used for the disc 1) is present in the disc 1, a potential difference $Vx$ is applied, in response to an input signal, between the contact areas 2 which causes an electrical field across the high field domain to reach a value of the order of $2\times10^5$ volts/cm.

(the actual value of the electrical field which may be greater or less than the electrical field required to form the high field domain, depends on the conductivity of the semiconductive material used for the disc 1, the length L of the disc 1, and the value of the applied potential), there is produced locally, at a position along the disc 1 where the high field domain is situated when the potential difference V*x* is applied, an increase in the free carrier concentration which causes the conductivity profile along the disc 1 to be modified. This increase in free carrier concentration manifests itself in the output circuit of the pulse generator unit during subsequent cycles of the high field domain in the form of a current spike at a point in time in the cycle equivalent to the momentary position of the high field domain within the disc when the potential difference V*x* was applied.

This current spike is due to the reduction of the material resistivity over that region in the disc 1 momentarily traversed by the high field domain when the potential difference V*x* was applied.

The conductivity profile decays as the increase in free carrier concentration decays, but the "memory" remains for a time equivalent to approximately 1 microsecond, this "memory" manifesting itself at the output in the form of a slowly decaying current spike.

By sensing the arrival of a high field domain at output 8 and applying regenerative feedback from output 8 to the pulse generator such that the potential difference V*x* is continuously applied between the contact areas 2 each time the high field domain reaches a selected fixed position along the disc 1, the conductivity profile at this selected position will become and remain modified so as to sustain the "memory."

By varying the magnitude of the potential difference V*x* applied between the contact areas 2 throughout the transit of a moving high field domain, the conductivity profile of the crystal 1 and therefore the magnitude of the output current will also be varied.

The localized decrease in resistivity can result (with a sufficiently high potential difference V*x*) in the conduction current in the disc 1 rising to the threshold value for the semiconductive material when the next high field domain propagates into this region. In this situation a new high field domain will be formed which will propagate along the disc 1 as far as the resistivity discontinuity. Further high field domains will continue to make only partial transits of the disc 1 until the excess carrier density decays to a level where the ohmic current during the passage of a high field domain no longer rises to the threshold value for the semiconductive material used for the disc 1. Thus the pulse generator unit exhibits a mode jump and oscillates for a short time at a higher frequency defined by the distance between the contact area 2 and the region of reduced resistivity until the excess carrier density decays to the appropriate level described in the above sentence.

It is thought that the phenomenon outlined in the preceding paragraphs is due to a form of impact ionization within the moving high field domain, the deep impurity levels being impact ionized and thus increasing the electron concentration in the conduction band.

This arrangement therefore provides a short term memory device for complex pulse waveforms.

It should be noted that when the electrical field due to the potential difference V*x* is less than the electrical field required to form the high field domain, the domain forming potential difference applied between the contact areas 2 must be applied as a voltage impulse of short duration in order to avoid impact ionization at that point immediately where the domain is formed.

Referring to FIGURE 2, a practical fabricated construction for the device shown in the drawing according to FIGURE 1 is shown and comprises a layer 6 of semiconductor material with the necessary electrical properties, for example gallium arsenide which is formed onto a semi-insulating substrate 7 by epitaxial growth. By using a suitable mask, the surface material is removed until a strip of the epitaxial layer 6 remains on the substrate 7 as shown in the drawing. Alternatively, a solid piece of semiconductor material could be used in place of the epitaxially deposited layer 6 and the substrate 7.

The contact areas 5, which may preferably comprise tin, are formed on the surface of the layers 6 and 7 (after appropriate masking), by vacuum evaporation to leave the requisite amount of epitaxial layer 6 exposed. The device is then heat treated, in a reducing atmosphere containing a fluxing agent, to alloy the metal-semiconductor joint and form an ohmic junction thereat.

While the principles of the invention have been described above in connection with specific embodiments, and particular modifications thereof, it is to be clearly understood that this description is made only by way of example and not as a limitation of the scope of the invention.

We claim:

1. Semiconductor apparatus for storing information corresponding to an input signal, comprising:

a body of semiconductor material exhibiting high field instability effects in portions of said body subjected to an electric field in excess of a given threshold value;

means for applying between spaced contact areas on said body a first potential difference to produce in at least one selected portion of said body an electric field of the order of said threshold value, so that a moving high field domain is formed at said selected portion;

means responsive to said input signal for applying a second potential difference at a point in time when said domain is momentarily situated at a local portion of said body, said increased potential difference causing the electric field at said local portion to substantially exceed said threshold value, so that the conductivity profile of said body is modified at said local portion, said modification persisting for at least a given time after said second potential is extinguished; and an output circuit for subsequently extracting from any external current flowing through said body an output signal representative of said input signal, said representative output signal persisting at least for said given time.

2. Semiconductor apparatus according to claim 1 wherein the distance travelled by said high field domain along said body and thereby the frequency of said external current is determined by the position in time of said first and second potential differences.

3. Semiconductor apparatus according to claim 1, wherein said body comprises gallium arsenide.

4. Semiconductor apparatus according to claim 1, further comprising feedback circuit means coupled between said output circuit and said second potential difference applying means, so that after the termination of said input signal said second potential difference is applied to said local portion at times when said domain is momentarily situated at said local portion.

5. Semiconductor apparatus according to claim 1, wherein said first and second potential differences are such that said given time is on the order of 1 microsecond.

References Cited

UNITED STATES PATENTS 3,365,583 1/1968 Gunn ------------ 331—107 XR

JOHN S. HEYMAN, Primary Examiner

JOHN ZAZWORSKY, Assistant Examiner

U.S. Cl X.R.

307—299; 331—107